United States Patent
Damy et al.

(10) Patent No.: US 8,049,582 B2
(45) Date of Patent: Nov. 1, 2011

(54) TRANSVERSAL FILTER

(75) Inventors: Jacques Antoine Damy, Nice (FR); Raphael Lardat, Roquefort les Pins (FR); Michel Peracchia, Le Rouret (FR)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 12/844,171

(22) Filed: Jul. 27, 2010

(65) Prior Publication Data

US 2011/0084780 A1    Apr. 14, 2011

Related U.S. Application Data

(63) Continuation of application No. PCT/EP2009/001889, filed on Mar. 16, 2009.

(30) Foreign Application Priority Data

Mar. 17, 2008  (EP) .................................... 08152842

(51) Int. Cl.
    *H03H 9/02*  (2006.01)
    *H03H 9/64*  (2006.01)
(52) U.S. Cl. ........................................ 333/193; 333/195
(58) Field of Classification Search .................. 333/133, 333/193, 194, 195, 196, 150, 151, 152, 153, 333/154
    See application file for complete search history.

(56) References Cited

U.S. PATENT DOCUMENTS

| 3,894,251 | A |   | 7/1975 | Shibayama et al. |
|---|---|---|---|---|
| 4,143,340 | A |   | 3/1979 | Hunsinger |
| 5,296,824 | A | * | 3/1994 | Cho et al. ....................... 333/193 |
| 6,462,633 | B1 | * | 10/2002 | Ichikawa ........................ 333/193 |
| 6,476,691 | B1 | * | 11/2002 | Tsuzuki et al. ................ 333/193 |
| 6,525,629 | B2 | * | 2/2003 | Matsuda et al. ............... 333/195 |
| 6,842,090 | B2 | * | 1/2005 | Ichikawa et al. .............. 333/193 |
| 7,304,553 | B2 | * | 12/2007 | Bauer et al. ................... 333/193 |
| 2003/0122449 | A1 |   | 7/2003 | Bergmann |

FOREIGN PATENT DOCUMENTS

| EP | 1 655 837 A2 | 5/2006 |
|---|---|---|
| WO | WO 97/10646 | 3/1997 |
| WO | WO 2009/115258 A1 | 9/2009 |

OTHER PUBLICATIONS

Hodé, J.M., et al., "SPUDT-Based Filters: Design Principles and Optimization," 1995 IEEE Ultrasonics Symposium, 12 pages.

* cited by examiner

*Primary Examiner* — Dean Takaoka
(74) *Attorney, Agent, or Firm* — Slater & Matsil, L.L.P.

(57) ABSTRACT

The filter includes at least one acoustic track formed on a piezoelectric substrate. At least one SAW input transducer and at least one SAW output transducer are arranged in each track. Each track has a RSPUDT structure and thus a distributed excitation. The excitation function includes sources arranged in a main lobe and a tail function including at least one tail lobe. A fine and precise approximation to the desired continuous excitation function is obtained by decreasing the excitation strength in the tail function by a factor of at least 2.

20 Claims, 5 Drawing Sheets

TRANSVERSAL FILTER

This application is a continuation of co-pending International Application No. PCT/EP2009/001889, filed Mar. 16, 2009, which designated the United States and was published in English, and which claims priority to European Application No. 08152842.4, filed Mar. 17, 2008, both of which applications are incorporated herein by reference.

TECHNICAL FIELD

The present invention relates to a transversal filter with a recursive character of the type RSPUDT (Resonant Single Phase Unidirectional Transducer) or DART (Distributed Acoustical Reflection Transducer) having an enhanced out of band rejection.

BACKGROUND

Transducers of the type RSPUDT are known, e.g., from an article of J. M. Hode, et al., "SPUDT-Based Filters: Design Principles and Optimization", 1995 IEEE ULTRASONICS SYMPOSIUM, pages 39-50. RSPUDT transducers are used in transversal filters. Filters using such transducers have a low insertion loss.

Designing an RSPUDT filter having a desired transfer function needs an optimization of the distribution of sources and reflectors over the length of a transducer. The piezoelectric substrate material is chosen to achieve a desired bandwidth which is dependent on the coupling factor of the material. Suppression of triple transit signals and a high out-of-band rejection is a question of sufficient resonant structures and the length of the transducer.

SUMMARY

In one aspect, the invention provides a filter having an increased precision of the discrete source distribution in an RSPUDT structure, thereby increasing the level of relative out of band rejection and modeling a desired transfer function.

The inventors have found that the usage of any apodized transducer without reflectors produces an insertion loss that is too high and does not sufficiently suppress triple transit signals. One way to get sufficient triple transit suppression and a small insertion loss is using acoustical reflection.

Another solution used is the serial connection of partial transducers that SAWTEK uses to approximate fan-shaped weighting, but it is definitely not good for the very long transducers that are necessary for this type of filter for high out of band rejection and sharp transition between passband and rejection band.

In one aspect, the invention solves the problem caused by relatively large band filters that can not be made using very reflective structures (acoustic cavities) which are more suited to small band filters (high selective filters).

Another aspect provides filters combining low insertion loss and easy withdrawal to achieve a good level of rejection far away from a pass band.

Another aspect provides a low loss filter in conjunction with a rejection performance given by transversal filters.

A transversal filter comprises a piezoelectric substrate and at least one acoustic track formed on the substrate. At least one SAW input transducer and at least one SAW output transducer are arranged in each track. At least one of the input transducer and the output transducer has a distributed excitation formed by distributing sources of excitation over the length of the transducer. The distribution of sources forms a continuous excitation function having a main lobe and at least one tail lobe with an excitation strength lower than that of the main lobe. The distribution of excitation is confined by reducing the excitation strength G of the tail lobes in view of the excitation strength S of the main lobe. It is preferred that S=x times G where x is a real number and $8 \geq x \geq 2$.

Reducing the excitation strength G of the tail lobes produces small weights of excitation being well suited to perfectly adapt the transfer function.

In a preferred embodiment, at least the input transducer of each track is divided into two parts to provide a main lobe sub-transducer and a tail lobe sub-transducer. This is done by electrically separating at least one bus bar of the input transducer into two parts. The two sub-transducer adjoining each other are arranged along a longitudinal axis parallel to the propagation direction of the acoustic wave. The "cut" into partial transducers or sub-transducers is done such that the main lobe of the excitation is assigned to the main lobe sub-transducer, the at least one tail lobe is assigned to the tail lobe sub-transducer. Now it is possible to drive the sub-transducers with different voltages or different signal amplitudes to result in different excitation strength. Hence apodization of the transducer and thus reduction of the acoustic aperture of the transducer is avoided. Thus, such a transducer is well adapted to a usage of reflective structures that apply over the whole aperture. This results in a filter having very low loss, e.g. well below 10 dB.

At least one transducer is recursive and thus has a preferred direction of wave propagation. Such a transducer can be constructed using SPUDT cells and/or RSPUDT cells. The at least one recursive transducer may comprise cells having a positive, negative or zero excitation. Each cell may be reflective or not, the reflection coefficient being positive, negative or zero. Reflection is used to form resonant cavities inside the transducer to lengthen the response and to get a sharp signal having a very small transition band.

In a preferred embodiment input and output transducer are of the same type. Both may be withdrawal weighted. In both transducers, the sources are distributed to form lobes comprising one main lobe and at least one tail lobe per transducer.

The filter may have two tracks directly adjoining each other in a direction transversal to the propagation of the acoustic wave. In the two tracks electrode finger arrangement is identical. Finger arrangement and the circuiting of the two tracks provide an excited acoustic wave having a continuous wave front over the whole aperture of the filter which, the sum of the apertures of the two tracks.

According to a preferred embodiment, the voltage applied to a transducer is reduced by circuiting two sub-transducer electrically in series. By series connecting the two tail lobe sub-transducers of a first track and a second track, the excitation strength G of the tail lobes reduces to a quarter of the original value if the capacitance of the tail lobe and the main lobe transducer is the same. In this case the voltage applied to each sub-transducer reduces to a half. If the main lobe sub-transducer in the first and second track of the filter are circuited electrically in parallel the excitation strength G in the tail lobes is reduced in view of the excitation strength S in the main lobes. This is equivalent to an arrangement where the main lobe sub-transducers of both tracks form together an unique transducer whose aperture $A_0$ equals the sum $A_1$ plus $A_2$ of the apertures of the first and second track. In a preferred embodiment the two tracks have the same aperture $A_1=A_2$.

The series connection of the tail lobe sub-transducers can be made in the input transducers and/or in the output transducers by circuiting the sub-transducers in series between two input terminals and/or two output terminals respectively. In a preferred embodiment, the sub-transducers of the input and output transducers are each circuited in series.

If the capacitance of the main lobe and tail lobe sub-transducers are equal in each track, the source strength of the main lobe (sub-transducers in parallel) is four times higher than the source strength of the tail lobe (sub-transducers in serial).

If the capacitance of the main lobe and tail lobe sub-transducers are different in each track, a capacitor may be circuited in series between the main lobe and tail lobe sub-transducer at least in the first track. The second track too may include such a capacitor. By means of these capacitors the voltage applied to the tail lobe sub-transducers can be adjusted to model more precisely the transducer's weight in the tail lobe.

Adjusting the capacitance of the capacitors allows a fine tuning of excitation strength relation S/G and thus a more exact modeling of the transfer function in the filter without changing the transducer structure. Preferably S is x times G and $3 \leq x \leq 5$. Preferably x is about four.

In this embodiment two capacitors may be included between respective sub-transducers in the input and output transducer as well.

According to an embodiment the capacitors are formed of a metallization having an interdigital finger structure. Preferably the fingers of the interdigital finger structure are rotated relative to the electrode fingers of the transducers. This way the capacitor can be easily incorporated into the filter and does not interact with the acoustic structures.

Another embodiment comprises a first track, a second track, a third track, and a fourth track. First and second tracks form a first filter unit, third and fourth tracks form a second filter unit. The two filter units directly adjoin each other and are electrically connected in series or parallel.

The structure of the first filter unit may be identical to the structure of the second filter unit. The two filter units may be shifted against each other by a multiple of $2\pi$ in the longitudinal direction.

A new advantage provided by these four tracks is a better rejection level far away from the pass band can be observed.

The filter may have a constant aperture over its length. The length of the filter comprises a length of the input transducer plus a length of the output transducer. This is a result of not apodizing the transducers.

An embodiment of the invention comprises a filter wherein each track comprises an input transducer and an output transducer. Input transducer and output transducer are similarly divided into sub-transducers such that the tail lobe sub-transducer of the input and output transducer are directly adjoining each other. The sub-transducers of the output transducer are circuited between two output terminals. The electrical connection of the sub-transducers between two input terminals being symmetrical to the electrical connection of the sub-transducers between two output terminals with respect to a mirror plane vertical to the tracks.

A filter having a high relative pass band width of, for example, more than 3% may be realized by using a high coupling substrate material for the filter. For this purpose the material may be selected from lithium niobate 17 or 128 and a lithium tantalate having a rot xy 112 cut. The tantalate is preferred in view of its better temperature behavior and its lower temperature coefficient of frequency.

BRIEF DESCRIPTION OF THE DRAWINGS

The invention is described in more detail by referring to the embodiments and the relating figures. As far as filter structures are shown the figures are schematic and not drawn to scale.

FIG. 3, shows two embodiments for a weighting with different source strengths;

DETAILED DESCRIPTION OF ILLUSTRATIVE EMBODIMENTS

Figure 1:
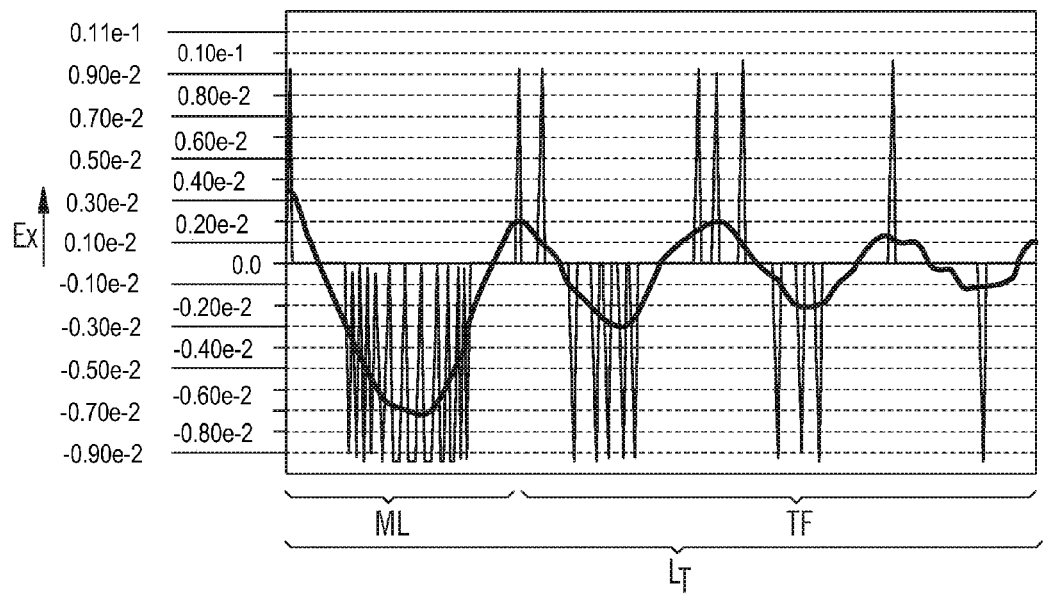
FIG. 1 shows a distribution of sources over the length of a transducer, each source having equal source strength.

Designing a filter having a distribution of sources comprises an optimization which is usually done by a computer program. FIG. 1 shows as a result the source strength plot along the length $L_T$ of the transducer. The continuous function in FIG. 1 results from an optimization considering sources continuously spread over the length of the transducer. Regarding this function, one can see that there is one main lobe ML with a high strength level, i.e., a great number of sources (excitation centers) and few secondary lobes at a lower level called tail function TF. This kind of acoustic strength distribution is often found by optimization tools for this type of filter (close to transversal filters). A source is realized by an exciting cell, each cell may have a length of lambda where lambda is a wavelength of the acoustic wave at center frequency of the transducer or filter respectively.

Preferably the cells have a SPUDT structure and thus an unidirectional behavior regarding the radiation and propagation of the acoustic wave. Between adjoining lobes, i.e., between main lobe and first tail lobe as well as between adjoining tail lobes a change of sign of excitation exists. Between two adjoining lobes a number of non-exciting cells may be arranged. These cells may be reflecting or not. The transducer is designed to have a long transition response. But it is very difficult to obtain a discrete source distribution that produces a good filter transfer function. The resulting transfer function does not match very well to the desired transfer function. The transfer function resulting in this withdrawal sampling is dramatically damaged compared to the one using a continuous function. This is particularly due to the poor approximation of the tail area where very few discrete sources are located.

The main difference between a desired and obtained transfer function is located at the out of band attenuation. It has been impossible to find discrete source distributions that would fulfill specific requirements of a desired filter or would result in a filter having desired filter properties.

The idea of the present invention is to realize a difference in source strength between the main lobe and tail function. Doing this, it is possible to reach a good level of source saturation in the discrete source distribution.

The response of the discrete source distribution is very similar to the response of the continuous distribution.

Figure 2:
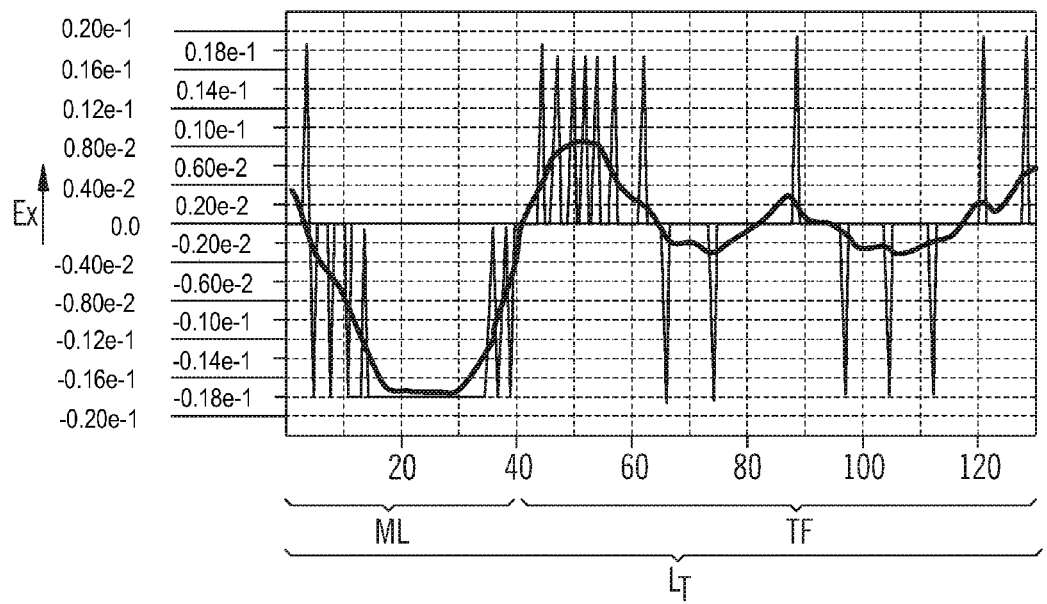
FIG. 2 shows a distribution of sources over the length of a transducer, main lobe and tail lobe having different source strength.

FIG. 2 shows a source distribution according to an embodiment of the invention where the source strength in the tail function is reduced by approximately a factor of four in this embodiment. So the idea is to use a source of strength S for the main lobe which well describes this lobe with a high level of saturation. To achieve good level of saturation in the tail lobes (secondary lobes) too, another source strength level G is used. In the case presented here G≈S/4. Doing so, the withdrawal error due to discretization of the continuous source distribution will be minimized and the transfer function of the discrete distribution fulfils desired customer requirements.

It is proposed to produce two areas within one transducer exhibiting two distinct source strengths. A high ratio of the respective source amplitudes S/G is preferred. The transducer may have a constant aperture along its length $L_T$. Thus, the technique of aperture apodization is excluded.

To result in two areas of different source strength in one transducer, the transducer is cut along its length to separate the main lobe from the tail function. Different voltage or signal amplitude may be applied to the two parts.

Figure 3A:
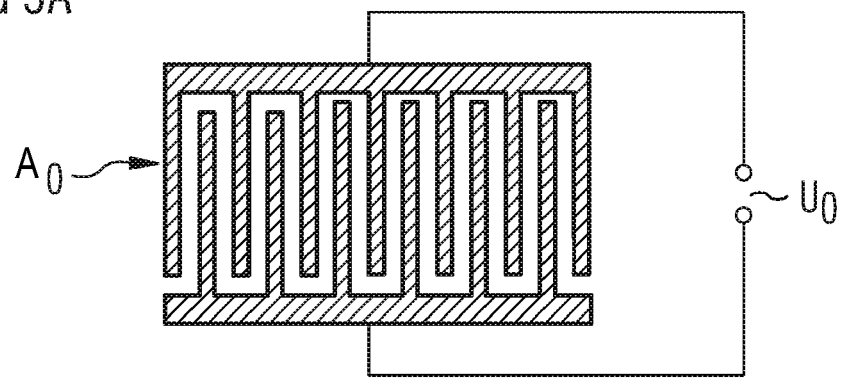
FIG. 3A, 3B, 3C, collectively
Figure 3B:
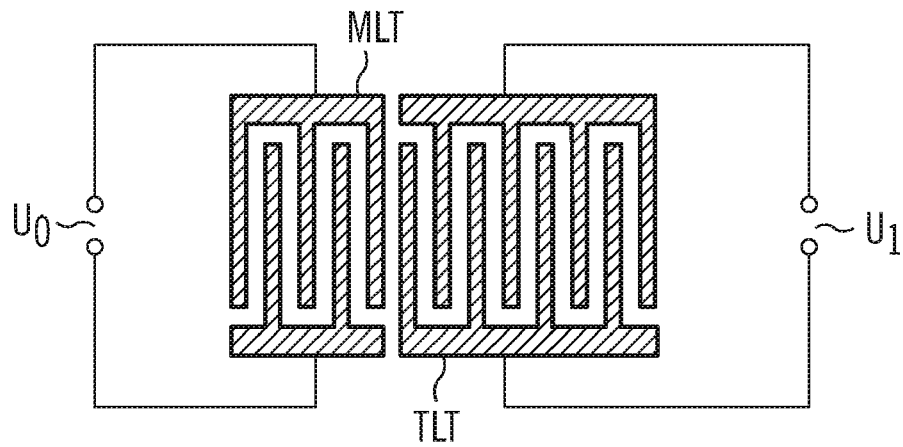

FIG. 3a shows a transducer which may be the input transducer of the filter before the cut. The transducer has an aperture $A_0$. FIG. 3b shows the transducer after the vertical separation which provides a main lobe sub-transducer MLT and a tail lobe sub-transducer TLT. A voltage $U_1$ may be applied to the tail lobe sub-transducer TLT being different from the original input voltage (signal amplitude) $U_0$. The reduced voltage is due to a voltage reduction of the original voltage $U_0$.

Figure 3C:
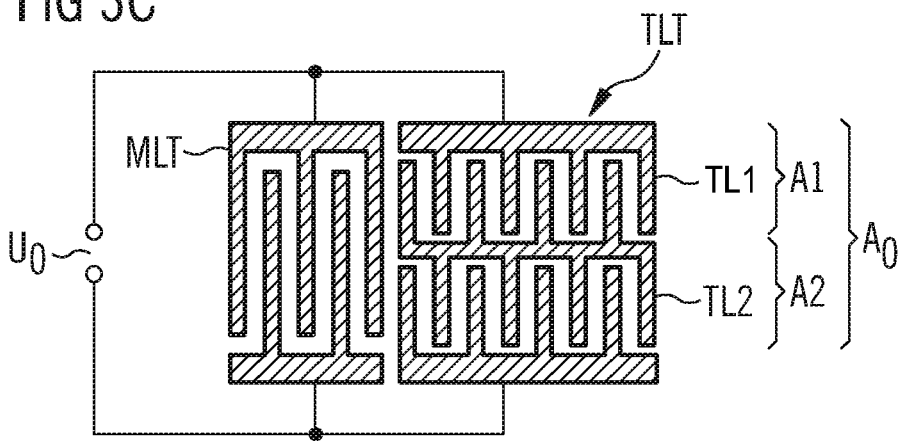

As seen in FIG. 3c a further cut is made along the aperture at least in the tail lobe sub-transducer TLT. This cut may be a division by two of the transducer aperture $A_0$, i.e., the separation is made in the middle. But is also possible to divide the transducer into two tracks having different apertures $A_1$, $A_2$ where $A_1 \neq A_2$. The such created two partial transducers can be electrically connected in series. Doing this, the voltage which is effective is reduced to $U_1=0.5$ times $U_0$ in the case where $A_1=A_2$. If $A_1 \neq A_2$, the effective voltages in the partial transducers are different too but always sum up to the original voltage $U_0$.

Having done the second cut in the main lobe sub-transducer MLT, the resulting two partial transducers corresponding to the upper and lower parts of the main lobe sub-transducer will be electrically connected is parallel. This parallel connection is equivalent to the main lobe sub-transducer having no horizontal cut along aperture and therefore corresponds to multiply the source strength of a partial transducer by a factor of two.

For the tail lobe sub-transducer two partial transducers TL1 and TL2 correspond to upper and lower parts of the tail lobe sub-transducer. In this embodiment, partial transducers TL1 and TL2 are electrically connected serially. This serial connection is equivalent to dividing the source strength by a factor of two.

Figure 4:
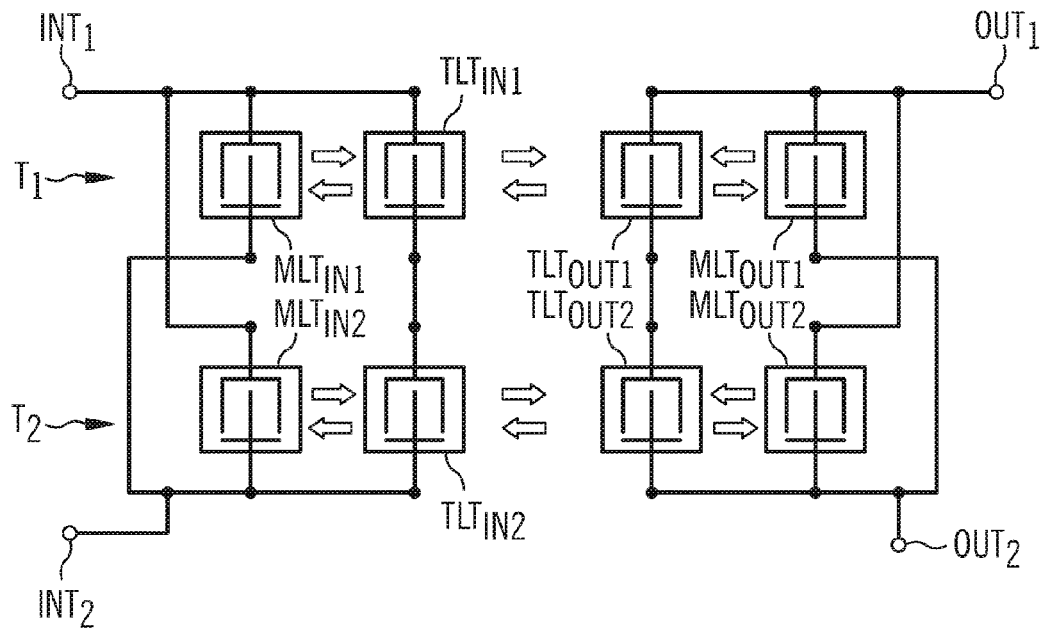
FIG. 4 shows a block diagram of a transducer arrangement according to an embodiment of the invention.

FIG. 4 shows a schematic block diagram of the electrical connection of the partial transducers of the filter. By the horizontal cut the filter now has two acoustic tracks T1 and T2. Each track comprises an input and an output transducer both of which are divided into a main lobe and a tail lobe sub-transducer. The partial transducers of the main lobe transducer, i.e., transducers $MLT_{IN1}$ and $MLT_{IN2}$ are connected in parallel. The partial transducers of the tail lobe transducer, i.e., transducers $TLT_{IN1}$ and $TLT_{IN2}$ are connected in series. The same connection of partial transducers and sub-transducers is made accordingly at the output transducer to result in four partial transducers $TLT_{OUT1}$, $TLT_{OUT2}$, $MLT_{OUT1}$ and $MLT_{OUT2}$.

If the capacitance of transducers $MLT_{IN1}$ (or $MLT_{IN2}$) and $TLT_{IN1}$ (or $TLT_{IN2}$) are equal, the source strength of $MLT_{IN1}/MLT_{IN2}$ in parallel is 4 times higher than the source strength of $TLT_{IN1}/TLT_{IN2}$ in serial. The low weights of the tail lobe transducers allow to discretize much more easily and precisely the tail function. Therefore the transfer function shows better rejection.

Figure 5:
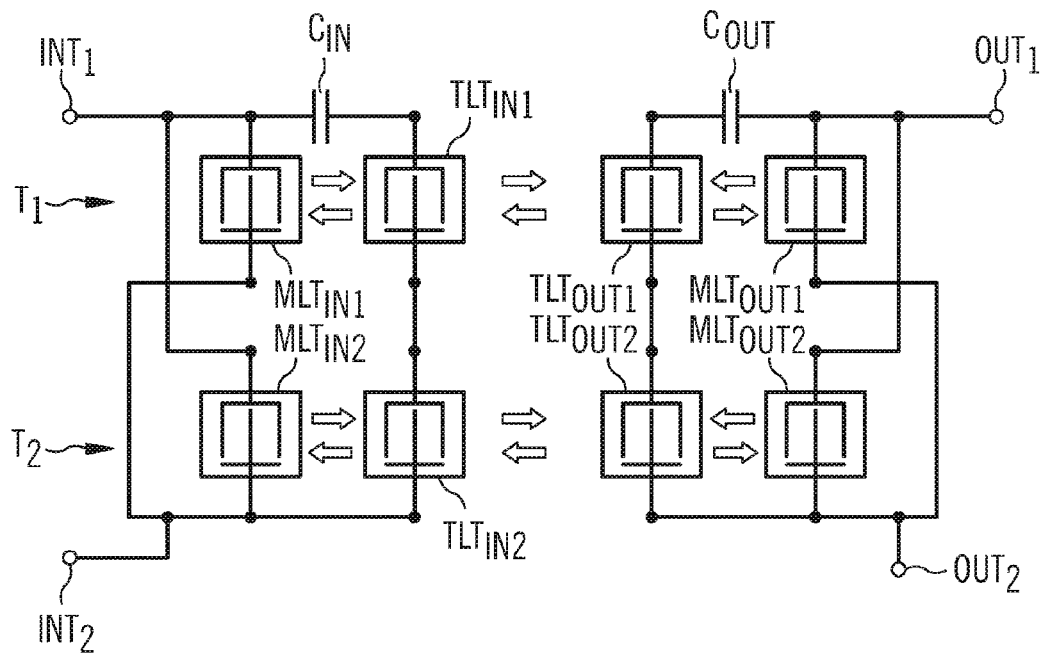
FIG. 5 shows a block diagram of a further embodiment of the invention using capacitors to adjust the source strength in the tail lobe sub-transducer.

If the capacitances of transducers are not equal in the main lobe and the tail lobe part, it is possible to adjust the desired ratio of source strength (ratio S/G: amplitude of source of the main lobe transducer divided by amplitude of source of tail transducer) by adding a serial capacitor $C_{IN}$ between input terminal INT1 and tail lobe sub-transducer $TLT_{IN1}$. FIG. 5 shows such an arrangement. This option gives another degree of freedom because the source strength in the tail lobe sub-transducers is reduced with increasing capacitance of $C_{IN}$. A respective capacitor $C_{OUT}$ may be circuited between output terminal OUT1 and tail lobe sub-transducer $TLT_{OUT1}$. Lower source strength allows to approximate more precisely the continuous distribution of source to obtain a better rejection level on the transfer function while performing withdrawal weighting.

Figure 6:
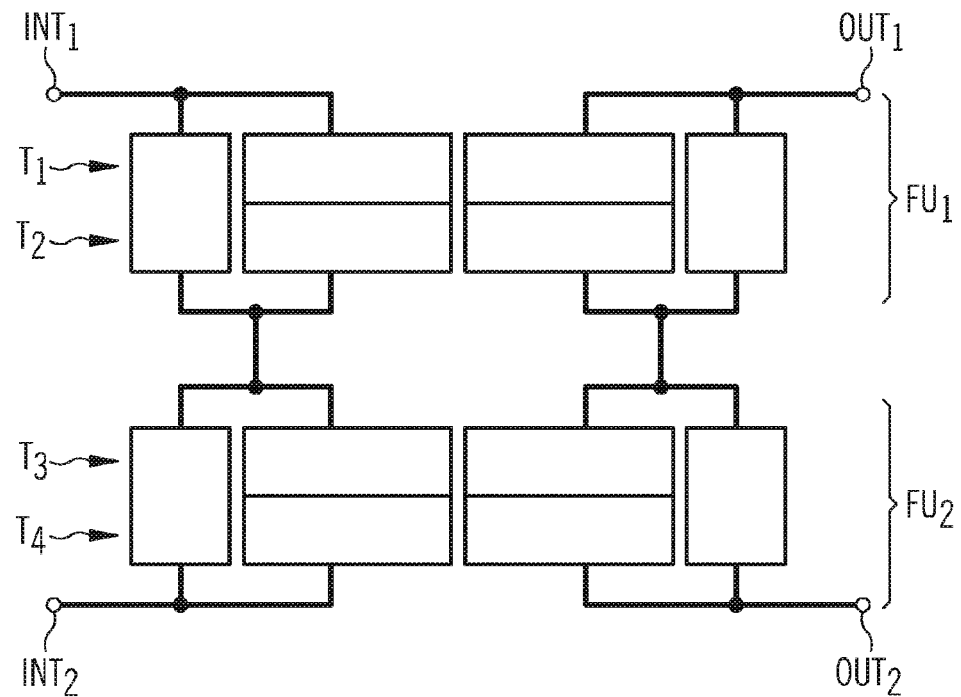
FIG. 6 shows in a block diagram an embodiment of a filter with four tracks.

FIG. 6 shows schematically an embodiment of the filter comprising four tracks $T_1$, $T_2$, $T_3$, and $T_4$. Each track comprises RSPUDT cells. The filter combines the advantages of the two tracks RSPUDT filter that is low loss, small size and balanced structure. The new advantage given by this 4-track-arrangement is a better rejection level out of passband due to source weighting by serial and parallel connections.

The upper two first tracks $T_1$, $T_2$, form a first filter unit FU1 and correspond to the two track filter as shown in FIG. 4 or 5. Third and fourth track $T_3$, $T_4$ form a second filter unit FU2. First and second filter unit FU1, FU2 are identical but shifted in phase against each other by n times lambda/2 and the potential applied to has opposite sign. This contributes to a better rejection level. The two filter units may be electrically connected in serial by simply connecting respective input and output terminals of the two filter units as shown in FIG. 6.

Figure 7:
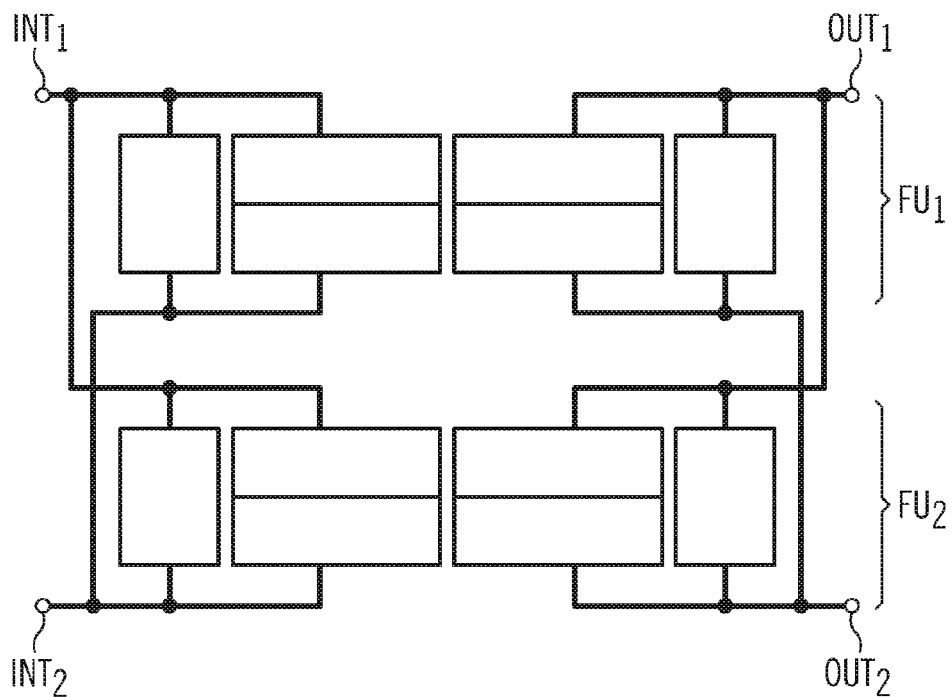
FIG. 7 shows another four-track-embodiment.
Figure 8:
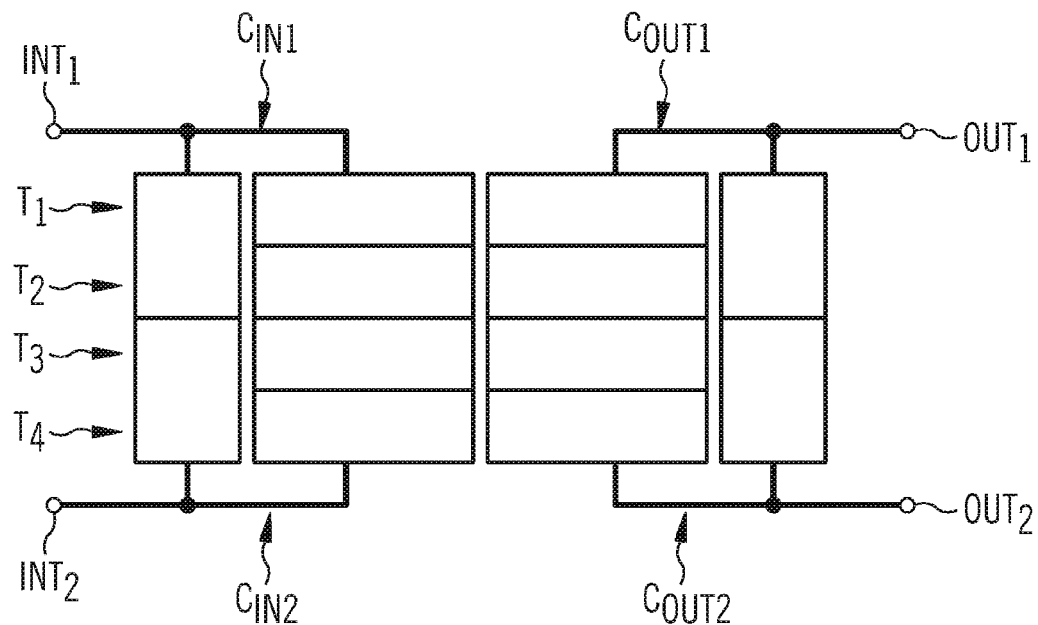
FIG. 8 shows a preferred four-track-embodiment.

As opposed to the depicted arrangement, the two filter units may be arranged directly adjoining each other as shown in FIG. 8 so that a common and continuous wave front may result after applying an RF signal to the input port. Alternatively the two filter units FU1, FU2 may be electrically connected in parallel as shown in FIG. 7. Depending on parallel or serial connection the impedance of the filter can be doubled (in view of a single filter unit) or remain unchanged in the parallel embodiment.

A continuous wave front along the entire aperture of two adjoining tracks is produced in order to minimize diffraction that could be generated by narrow aperture tracks. This can be done by a single main lobe sub-transducer MLT that extends over both tracks. The tail lobe sub-transducers $TLT_1$, $TLT_2$ are identical in both tracks and put one on top of the other without any symmetry in view of a horizontal symmetry axis.

As a result there is no phase discontinuity between main lobe and tail lobe sub-transducers.

In an embodiment specific filter requirements comprise the following features:

Relative bandwidth: 4.8%

Transition bandwidth (at the pass band skirts where the signal is attenuated from −3 to −10 dB): 0.1%

Insertion loss: 10 and smaller

Out of band rejection: below 50 dB.

These features are obtained with a filter according to an embodiment of the invention using a piezoelectric substrate material like Lithium tantalate rot xy 112° and a good electrical matching of the filter. The fine discrete approximation allows to obtain very precise time response. The filter comprises DART and or RSPUDT structures providing sufficient resonant structures to achieve a good level of triple transit transition and thus a flat pass band.

Figure 9:
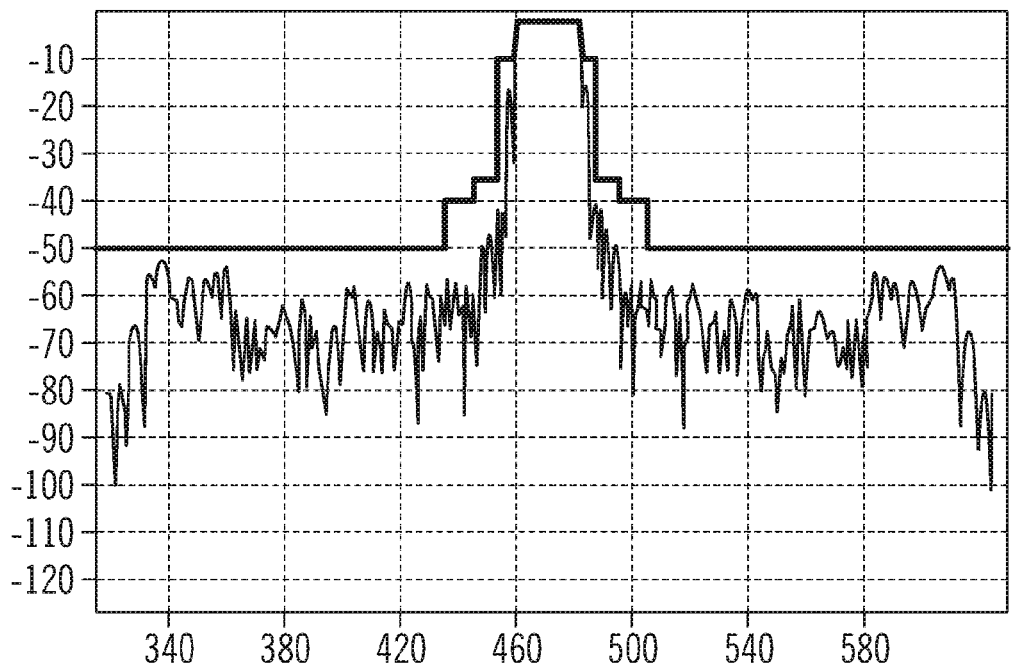
FIG. 9 shows a transfer function of a filter of a four-track-embodiment.

FIG. 9 shows the transfer curve of the filter according to this embodiment. A four track arrangement is used. A broad pass band around a center frequency of 468 MHz and a very good rejection level in the near and far rejection band are striking and support the advantage that may be obtained with filters according to the invention.

The invention shall not be limited by the depicted figures and the described embodiments which are only representative examples and do not cover all variations that are allowed by the claims. Combinations of features given in different embodiments are possible as well as variations of given precise values without deviating from the spirit of the invention.

What is claimed is:

1. A transversal filter, comprising
a piezoelectric substrate;
at least one acoustic track formed on the piezoelectric substrate; and
at least one SAW input transducer and at least one SAW output transducer arranged in each track;
wherein at least one input transducer and at least one output transducer has a distributed excitation comprising
a continuous excitation function having a main lobe and at least one tail lobe with a sign of excitation different than the main lobe; and
an excitation strength S in the main lobe being greater than an excitation strength G of the at least one tail lobe by a factor of x, where $8 \geq x \geq 2$, x and x is a real number;
wherein the at least one input transducer of each track is divided into a main lobe sub-transducer and a tail lobe sub-transducer by electrically separating at least one bus bar of the input transducer into two parts;
wherein the main lobe and tail lobe sub-transducers adjoining each other in a longitudinal direction; and
wherein the main lobe of excitation being assigned to the main lobe sub-transducer, the at least one tail lobe being assigned to the tail lobe sub-transducer.

2. The filter of claim 1, wherein at least one transducer is recursive and has a preferred direction of wave propagation.

3. The filter of claim 2, wherein the input transducer is withdrawal weighted and comprises SPUDT cells.

4. The filter of claim 3, wherein the input and output transducers are of the same type.

5. The filter of claim 1, wherein the at least one acoustic track comprises at least two tracks;
wherein a finger arrangement in the at least two tracks is essentially identical;
wherein the at least two tracks directly adjoin each other in a direction transversal to a propagation of an acoustic wave; and
wherein the finger arrangement and circuiting of the input and output transducers are such that an excited acoustic wave has a continuous wave front over the entire aperture of the filter.

6. The filter of claim 1, comprising first and second tracks,
in the first and second tracks, the main lobe sub-transducer of the at least one input transducer being a unique transducer with an aperture summarizing apertures of the first and second tracks,
the main lobe sub-transducer being electrically connected to two input terminals;
the tail lobe sub-transducers of the input transducer in the first and second track being electrically connected in series between the two input terminals.

7. The filter of claim 1, wherein a capacitor is circuited between an input bus bar of the main lobe sub-transducer and an input bus bar of the tail lobe sub-transducer.

8. The filter of claim 7, wherein the capacitor comprises a metallization having an interdigital finger structure, fingers of the interdigital finger structure being rotated relative to electrode fingers of the input and output transducers.

9. The filter of claim 1, comprising
a first track and a second track forming a first filter unit;
a third track and a fourth track, forming a second filter unit; and
the first and second filter units directly adjoining each other and being electrically connected in series or parallel.

10. The filter of claim 1, having a constant aperture over a length of the filter, the aperture comprising a length of input transducer plus a length of output transducer, the transducer being not apodized.

11. The filter of claim 1, where $S = x \cdot G$ and $3 \leq x \leq 5$.

12. The filter of claim 11, where x is about 4.

13. The filter of claim 1, wherein each track comprises an input transducer and an output transducer;
the input transducer and output transducer being similarly divided in sub-transducers;
a tail lobe sub-transducer of the input and output transducer directly adjoining each other;
the sub-transducers of the output transducer being circuited between two output terminals;
wherein an electrical connection of the sub-transducers between two input terminals is symmetrical to an electrical connection of sub-transducers between the two output terminals.

14. The filter of claim 1, wherein the substrate comprises a high coupling material.

15. The filter of claim 14, wherein the substrate comprises lithium tantalate having a rot xy 112 cut.

16. The filter of claim 9, wherein the first filter unit is identical to the second filter unit.

17. The filter of claim 16, wherein identical filter units are shifted against each other in a longitudinal direction such that their phases are matching and the filter has a continuous wave front.

18. A transversal filter, comprising:
a piezoelectric substrate;
at least one acoustic track formed on the piezoelectric substrate; and
at least one SAW input transducer and at least one SAW output transducer arranged in each track;
wherein at least one input transducer and at least one output transducer has a distributed excitation comprising
a continuous excitation function having a main lobe and at least one tail lobe with a sign of excitation different than the main lobe; and
an excitation strength S in the main lobe being greater than an excitation strength G of the at least one tail lobe by a factor of x, such that $S = x \cdot G$ where $3 \leq x \leq 5$.

19. The filter of claim 18, where x is about 4.

20. A transversal filter, comprising:
a piezoelectric substrate;
at least one acoustic track formed on the piezoelectric substrate; and
at least one SAW input transducer and at least one SAW output transducer arranged in each track;
wherein at least one input transducer and at least one output transducer has a distributed excitation comprising
a continuous excitation function having a main lobe and at least one tail lobe with a sign of excitation different than the main lobe; and an excitation strength S in the main lobe being greater than an excitation strength G of the at least one tail lobe by a factor of x, where $8 \geq x \geq 2$, x and x is a real number;

wherein each track comprises an input transducer and an output transducer, the input transducer and output transducer being similarly divided in sub-transducers;

wherein a tail lobe sub-transducer of the input and output transducer directly adjoin each other;

wherein the sub-transducers of the output transducer being circuited between two output terminals; and wherein an electrical connection of the sub-transducers between two input terminals is symmetrical to an electrical connection of sub-transducers between the two output terminals.

* * * * *